(12) United States Patent
Henzler et al.

(10) Patent No.: US 11,699,977 B2
(45) Date of Patent: Jul. 11, 2023

(54) DIGITAL ENVELOP TRACKER FOR POWER AMPLIFIER

(71) Applicant: Intel Corporation, Santa Clara, CA (US)

(72) Inventors: Stephan Henzler, Munich (DE); Christian Kranz, Ratingen (DE); Otto Schumacher, Dachau (DE); Bernhard Sogl, Unterhaching (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/059,489

(22) PCT Filed: Oct. 15, 2019

(86) PCT No.: PCT/US2019/056179
§ 371 (c)(1),
(2) Date: Nov. 30, 2020

(87) PCT Pub. No.: WO2020/139443
PCT Pub. Date: Jul. 2, 2020

(65) Prior Publication Data
US 2021/0376795 A1    Dec. 2, 2021

(30) Foreign Application Priority Data
Dec. 27, 2018    (EP) .................... 18248077

(51) Int. Cl.
*H03F 1/02*    (2006.01)
*H03F 3/21*    (2006.01)

(52) U.S. Cl.
CPC ............ *H03F 1/0216* (2013.01); *H03F 3/21* (2013.01); *H03F 2200/105* (2013.01); *H03F 2200/171* (2013.01)

(58) Field of Classification Search
CPC .... H03F 1/0216; H03F 3/21; H03F 2200/105; H03F 2200/171; H03F 3/19; H03F 1/025; H03F 1/0227
(Continued)

(56) References Cited

U.S. PATENT DOCUMENTS

2015/0155834 A1    6/2015  Ripley et al.
2015/0280795 A1   10/2015  Wimpenny
(Continued)

FOREIGN PATENT DOCUMENTS

KR    10-1128485 B1    3/2012

OTHER PUBLICATIONS

Florian Corrado et al.: "Envelope Tracking of an RF High Power Amplifier with an 8-Level Digitally Controlled GaN-on-Si Supply Modulator", IEEE Transactions on Microwave Theory and Techniques, Plenum, USA, vol. 63, No. 8, Aug. 2, 2015, pp. 2589-2602.
(Continued)

*Primary Examiner* — Hafizur Rahman
*Assistant Examiner* — Khiem D Nguyen
(74) *Attorney, Agent, or Firm* — 2SPL Patent Attorneys PartG mbB

(57) ABSTRACT

A digital envelop tracker for a power amplifier. The digital envelop tracker includes a supply filter for filtering a supply voltage to a power amplifier, a level selection circuitry configured to determine a level of supply voltage based on an instantaneous power of an input data stream, schedule a series of switching events based on the determined level of supply voltage, and generate a level select signal based on the scheduled series of switching events, and a switch for connecting one of supply voltages to the supply filter based on the level select signal. The level selection circuitry schedules a primary switching event of the switch based on the determined level of supply voltage and secondary
(Continued)

switching events of the switch delayed with respect to the primary switching event based on the determined level of supply voltage to generate a filter response of the supply filter with smaller peaking.

15 Claims, 13 Drawing Sheets

(58) Field of Classification Search
USPC .......................................... 330/136, 296–297
See application file for complete search history.

(56) References Cited

U.S. PATENT DOCUMENTS

| | | |
|---|---|---|
| 2015/0372646 A1 | 12/2015 | Briffa et al. |
| 2016/0099686 A1 | 4/2016 | Perreault |
| 2018/0076772 A1 | 3/2018 | Khesbak et al. |

OTHER PUBLICATIONS

Rodriguez M. et al.: "Multilevel Converter for Envelope Tracking in RF Power Amplifiers", Energy Conversion Congress and Exposition, 2009, ECCE. IEEE, IEEE, Piscataway, NJ, USA, Sep. 20, 2009, pp. 503-510.

First primary switching event and secondary switching events

Second primary switching event and secondary switching events

Overlapping result

First primary switching event and secondary switching events

Second primary switching event and secondary switching events

Overlapping result

DIGITAL ENVELOP TRACKER FOR POWER AMPLIFIER

CROSS-REFERENCE TO RELATED APPLICATIONS

This application is a 35 U.S.C. § 371 (c) national stage entry of PCT Patent Application PCT/US2019/056179, which was filed on Oct. 15, 2019. That application claimed priority to European Patent Application No. 18248077, which was filed on Dec. 27, 2018. The contents of the earlier filed applications are incorporated herein by reference in their entirety as if fully set forth.

FIELD

Examples relate to a digital envelop tracker for a power amplifier, more particularly a digital envelop tracker with a low loss supply filter for the radio frequency (RF) power amplifier and with lower peaking.

BACKGROUND

Envelope tracking is a scheme to adjust a supply voltage to an RF power amplifier to ensure that the RF power amplifier operates close to its peak efficiency. In digital envelope tracking the supply voltage to the RF power amplifier is discrete voltage levels. The envelope tracker switches stepwise between these discrete voltage levels depending on the instantaneous RF power of an input data stream. A supply filter (e.g. a passive filter) between the switch and the PA power amplifier input is used to smoothen the transition from one voltage level to another, to achieve low out-of-band noise levels, and to notch out noise at the receiver duplex frequency gaps. This supply filter needs to have low losses because any loss in the supply filter reduces the efficiency of the overall envelope tracking. In addition, the step response of the supply filter needs to not peak much because the peaking would lead to a violation of the maximum voltage requirement of the power amplifier. The two requirements are contradictory because a lossless LC filter does peak and ring.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
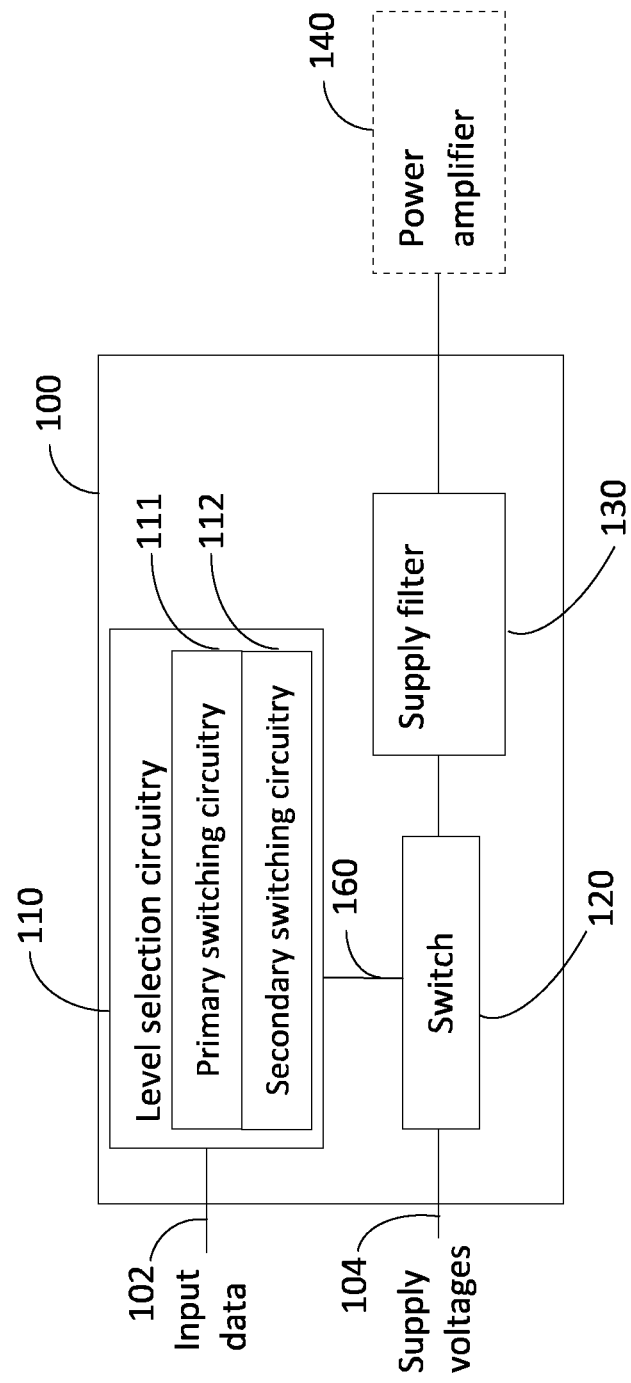
FIG. 1 is a block diagram of a digital envelop tracker in accordance with one example.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In order to reduce peaking in step response of the supply filter, a snubber network, which is a capacitor in series with a resistor, may be used. The resistor in the snubber network dissipates the ringing energy so reduces the peaking. Peaking is reduced by burning the energy. However, this scheme increases alternating current (AC) losses in the supply filter so that the efficiency of the digital envelope tracker decreases.

Examples are disclosed for a digital envelop tracker with a low-loss and high-Q supply filter for the RF power amplifier and with lower peaking so as not to violate the maximum voltage requirement of the RF power amplifier.

FIG. 1 is a block diagram of a digital envelop tracker 100 in accordance with one example. The digital envelop tracker 100 may include a level selection circuitry 110, a switch 120, and a supply filter 130. The supply filter 130 is configured to filter a supply voltage 104 supplied to a power amplifier 140. The supply voltages 104 are discrete voltage levels and the envelope tracker 100 switches stepwise between these discrete voltage levels depending on the instantaneous RF power of an input data stream 102. The supply filter 130 between the switch 120 and an input of the power amplifier 140 is used to smoothen the transition of the supply voltage from one level to another. The supply filter 130 may be a passive filter.

The level selection circuitry 110 is configured to determine a level of the supply voltage based on an instantaneous RF power of an input data stream 102, schedule a series of switching events of the switch 120 based on the determined level of supply voltage, and generate a level select signal 160. The instantaneous RF power measurement is an instantaneous power prediction ahead in time. The instantaneous power is not necessarily the power required at the current time instance but is the value slightly in the future. The switch 120 is configured to connect one of a plurality of supply voltages 104 in different levels to the supply filter 130 based on the level select signal 160. The level select signal 160 may trigger an increase, a decrease, or no change of the supply voltage from the current supply voltage level. The switch 120 switches to a higher or lower level or does not change based on the level select signal 160. In examples, the level selection circuitry 110 is configured to schedule a series of switching events of the switch 120 based on the determined level of supply voltage.

In examples, the level selection circuitry 110 includes a primary switching circuitry 111 and a secondary switching circuitry. The primary switching circuitry 111 is configured to initiate primary switching events based on the instantaneous power of the input data stream 102 and the secondary switching circuitry 112 is configured to schedule secondary (i.e. delayed, derived) switching events of the switch 120 in response to the primary switching events. The primary switching event is a switching event of the switch 120 scheduled based on the instantaneous power of the input data stream. The secondary switching event is switching events of the switch 120 scheduled in response to the primary switching event after predetermined periods of time from the primary switching. For example, if a primary switching event is scheduled for up-switching, the secondary switching events may be down-switching followed by up-switching after certain period of times, respectively.

The secondary switching circuitry 112 is configured to cause the secondary switching at time instances after the primary switching to generate a filter response of the supply filter 130 with smaller peaking (i.e. smaller overshoots or undershoots). The secondary switching circuitry 112 translates the switch selection event (i.e. the primary switching) into a train of switching events.

Since the supply voltages 104 are discrete voltage levels one of which is switched by the switch 120 the supply voltage abruptly changes when the switch 120 switches from one voltage level to another. This causes a step response of the supply filter 130. A step response is a transient response (behavior) of a system (e.g. the supply filter 130) to a step input. A typical step response of the system is a damped oscillation where the output of the system oscillates until it reaches a steady state. In examples, the train of switching events are chosen such that the output signal from the supply filter 130 is an advantageous superposition of multiple filter step responses which effectively leads to a filter response with much smaller peaking.

In examples disclosed herein, low peaking at the output of the supply filter 130 (i.e. at the supply pin of the power amplifier 140) can be achieved with a small or even without a snubber resistor. This reduces the power consumption in the supply filter 130 and so increases the efficiency of digital envelope tracking. In addition, a simpler supply filter topology is possible.

Figure 2:
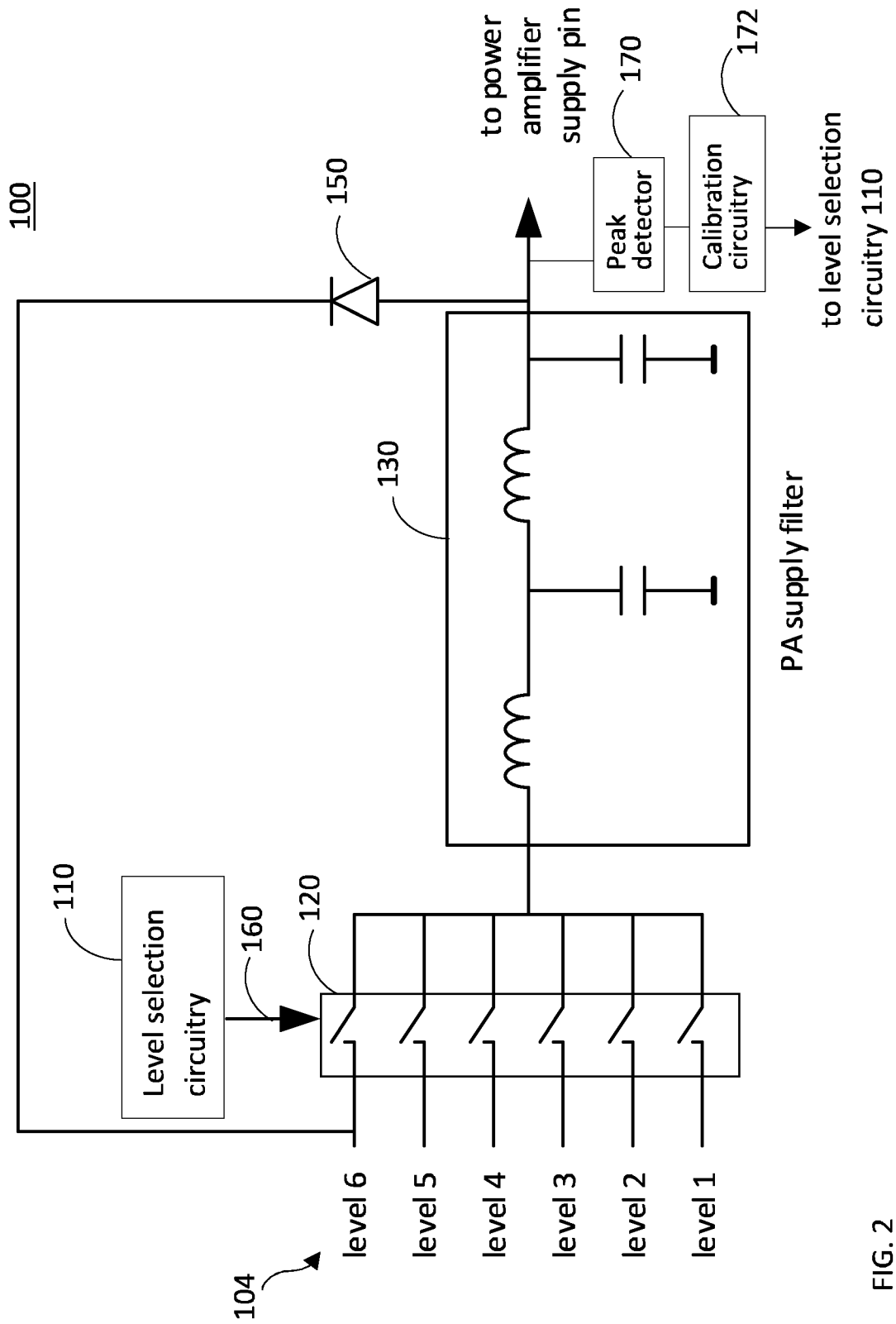
FIG. 2 shows a digital envelop tracker in accordance with one example.

FIG. 2 shows a digital envelop tracker 100 in accordance with one example. The digital envelop tracker 100 includes a level selection circuitry 110, a switch 120, and a supply filter 130. The digital envelop tracker 100 may include a clamping device (e.g. a clamping diode 150) for limiting the output voltage from the supply filter 130 for safety reasons. In this example, one of six voltage levels is supplied to the supply filter 130 via the switch 120. It should be noted that the configuration shown in FIG. 2 is merely an example, and the number of supply voltage levels may be more or less than 6 and may be any number.

The supply filter 130 filters the supply voltage 104 provided through the switch 120 and then provides the filtered supply voltage to a power amplifier. The supply filter 130 may be configured to pass or reject specific frequency band and may be used for extracting a specific frequency band or rejecting for noise reduction.

The supply filter 130 may be an LC filter comprising an inductor(s) and a capacitor(s). The supply filter 130 may include cascaded inductor-capacitor networks. In the example shown in FIG. 2, the supply filter 130 includes a series inductor and a shunt capacitor. It should be noted that the filter configuration shown in FIG. 2 is merely an example, and the supply filter 130 may be designed differently. The supply filter 130 may not include a snubber resistance, as shown in FIG. 2, so that peaking might occur but AC power dissipation would be reduced.

Figure 6:
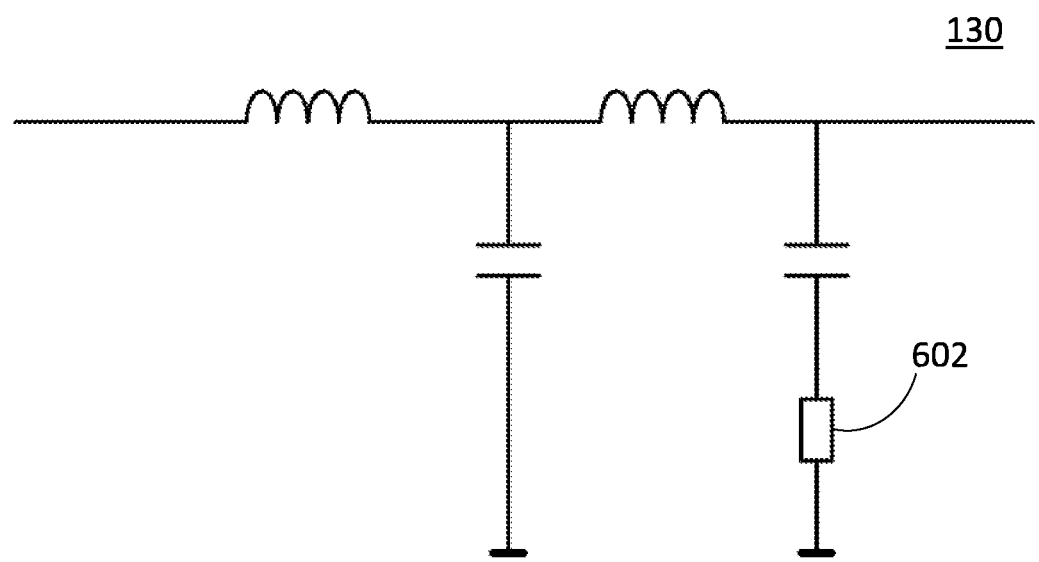
FIG. 6 shows an example supply filter with a snubber resistance.

Alternatively, the supply filter 130 may include small snubber resistance. FIG. 6 shows an example supply filter with a snubber resistance 602.

The level selection circuitry 110 determines a level of the supply voltage based on an instantaneous RF power of an input data stream and outputs the level select signal 160 to the switch 120. In this example in FIG. 2, one of six voltage levels is selected based on the level select signal 160.

Figure 3:
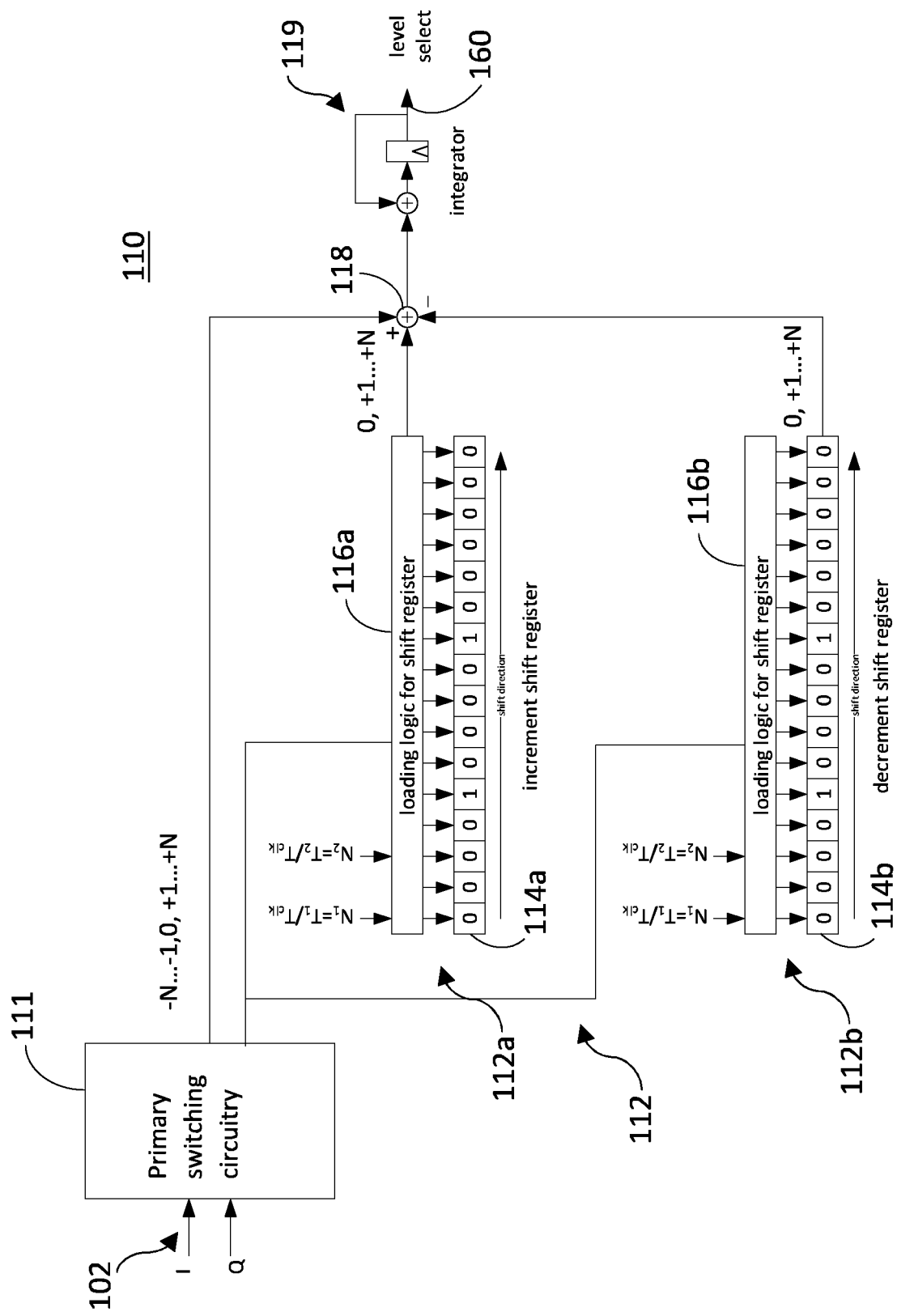
FIG. 3 shows details of a level selection circuitry in accordance with one example.

FIG. 3 shows details of a level selection circuitry 110 in accordance with one example. The level selection circuitry 110 may be part of a transceiver or tracker chip. The level selection circuitry 110 may include a primary switching circuitry 111, a secondary switching circuitry 112, and a combiner 118. The primary switching circuitry 111 receives input data stream 102, determines a level of the supply voltage for the power amplifier based on an instantaneous RF power of the input data stream 102, and determines a primary switching event. The input data stream 102 may be in an in-phase/quadrature (I/Q) format (i.e. Cartesian coordinate format) or alternatively in a polar coordinate format. The input data stream 102 (e.g. IQ signals) determines which level needs to be used to give enough power supply headroom to the power amplifier 140.

The primary switching circuitry 111 determines whether the currently supplied voltage level should be increased or decreased. The increase or decrease may be step-wise. For example, the primary switching circuitry 111 may output one of an integer value −N, . . . , −1, 0, +1, . . . , +N for decrease, no change, or increase of the currently supply voltage level. The increase or decrease of the supply voltage level may be one step or multiple steps of increase or decrease.

The level selection circuitry 110 (e.g. the primary switching circuitry 111) may include a threshold detector. The data stream coming in (e.g. as IQ data) is converted to a magnitude value that represents the instantaneous magnitude of the RF signal. This magnitude value may be compared against thresholds and based on this comparison the most appropriate voltage level may be chosen, (e.g. the smallest voltage level which is larger than the magnitude value). This determination is done a little bit forward looking, (i.e. when the magnitude is supposed to get larger than a certain threshold), and then the respective voltage level is selected. In accordance with examples disclosed herein, the primary switching events are determined based on the threshold comparison and the primary switching events are extended by secondary (derived) switching events.

The primary switching circuitry 111 (e.g. the threshold detector) may fill voltage level increase and decrease events (or commands) into loading logic 116a/116b (e.g. a scheduler) based on forward looking comparison of the input data magnitude with input data magnitude threshold levels. The loading logic 116a/116b may schedule and trigger future voltage level increase and decrease events.

The scheduler (e.g. the loading logics) may include a first scheduler configured to schedule and trigger future voltage level increase events/commands and a second scheduler configured to schedule and trigger future voltage level decrease events/commands. The primary switching circuitry (the threshold detector) may fill voltage level increase events/commands into the first scheduler and voltage level decrease events/commands into the second scheduler based on forward looking comparison of the input data magnitude with input data magnitude threshold levels. The combiner 118 may combine the level increase events from the first scheduler and the voltage level decrease events from the second scheduler into a voltage level selection signal.

This primary switching event may trigger scheduling of secondary (delayed) switching events. The secondary switching circuitry 112 may cause the secondary switching events in response to the primary switching event. The secondary switching event is a switching event derived from the primary switching event to cause the switch 120 to transition to different levels after predetermined delayed periods from the primary switching. The secondary switching events are scheduled and stored, for example, in a shift register or alternatively in a task list. After the delay time the secondary switching events are combined with the then-current primary switching events in the combiner 118 to generate the level select signal 160.

The series of switching events may be scheduled such that a first step response of the supply filter 130 is combined with second and third step responses of the supply filter 130 such that a steady state value of combination of step responses is equal to a steady state value of the first step response and peaking of the combination of step responses is less than peaking of the first step response.

FIG. 4A shows an example of primary switching without secondary (delayed) switching and FIG. 4B shows an example of primary switching with secondary (delayed) switching. In FIGS. 4A and 4B, the switching events are provided as a pulse train. The rising edge indicates incremental switching in which the switch 120 will switch to a higher level of supply voltage and the falling edge indicates decremental switching in which the switch 120 will switch to a lower level of supply voltage. In this example shown in FIGS. 4A and 4B, the primary switching event 402 is an incremental switching. The first secondary switching event 404 occurs at a first delay time (T1) after the primary switching event 402 and a second secondary switching event 406 occurs at a second delay time (T2) after the first secondary switching event 404. Both the first and second secondary switching events 404, 406 are derived from the primary switching event 402. FIG. 4B shows two secondary switching events 404, 406 derived from the primary switching event 402, but as an alternative, more than two secondary switching events may be scheduled. The examples disclosed herein are explained with reference to the case that two secondary switching events are scheduled, but the examples are not limited to such case, and may be extended to a case with three or more secondary switching events. FIG. 4B shows that the amount of changes of the supply voltages in the secondary switching 404, 406 are the same as the amount of change in the primary switching 402 (e.g. one step up in the primary switching 402, one step down in the first secondary switching 404 and one step up in the second secondary switching 406). Alternatively, the amount of changes in the secondary switching 404, 406 may be different from the amount of change in the primary switching 402 (e.g. one step up in the primary switching 402, two steps down in the first secondary switching 404 and two steps up in the second secondary switching 406).

Figure 4:
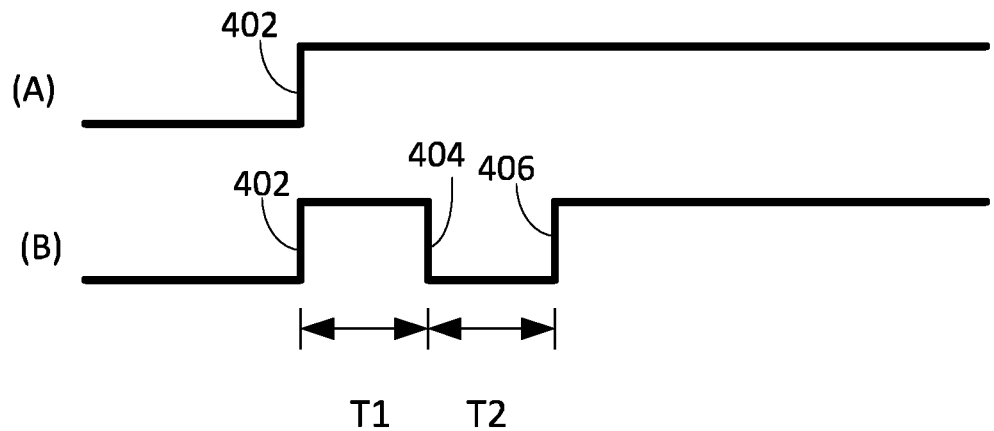
FIG. 4A shows an example of switching without delayed switching.
FIG. 4B shows an example of switching with delayed switching.

In the example shown in FIG. 4, the switch 120 for the level selection may be switched forth-back-forth (i.e. increment-decrement-increment). In this case, the secondary switching may yield a superposition of two positive step responses and one negative step response which can cancel out the peaks in the step response of the supply filter 130. In case that the primary switching event is decrement switching, the train of switching may be back-forth-back (i.e. decrement-increment-decrement).

The secondary switching circuitry 112 may cause the secondary switching events at time instances after the primary switching event to generate a filter response of the supply filter 130 with smaller peaking. The secondary switching events are chosen such that the output signal from the supply filter 130 is an advantageous superposition of multiple filter step responses which effectively leads to a filter response with much smaller peaking.

Referring to FIG. 3, the secondary switching events may be scheduled and stored, e.g. in a shift register or alternatively in a task list, or the like. For example, the secondary switching circuitry 112 may include an increment shift register 114a to store a secondary switching event for increment and a decrement shift register 114b to store a secondary switching event for decrement.

Figure 5A:
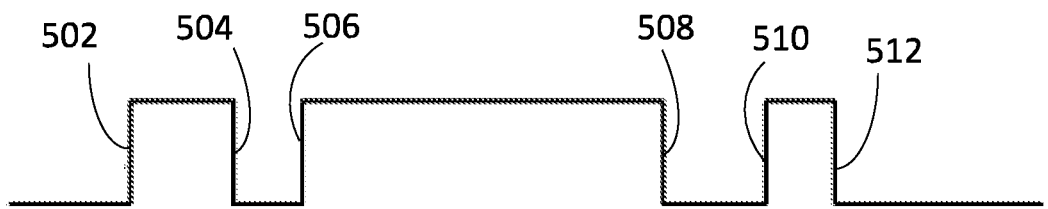
FIG. 5A shows examples of delayed switching events as pulse train.

FIG. 5A shows examples of delayed switching events as pulse train. The switching events 502 and 508 are the regular primary switching events determined based on the instantaneous power level of the input data stream. The primary switching event 502, 508 may be an incremental switching or a decremental switching. The switching events 504 and 512 are secondary switching events derived from the primary switching events 502 and 508, respectively, to be stored in the decrement shift register 114b. The switching events 506 and 510 are secondary switching events derived from the primary switching events 502 and 508, respectively, to be stored in the increment shift register 114a.

Figure 5B:
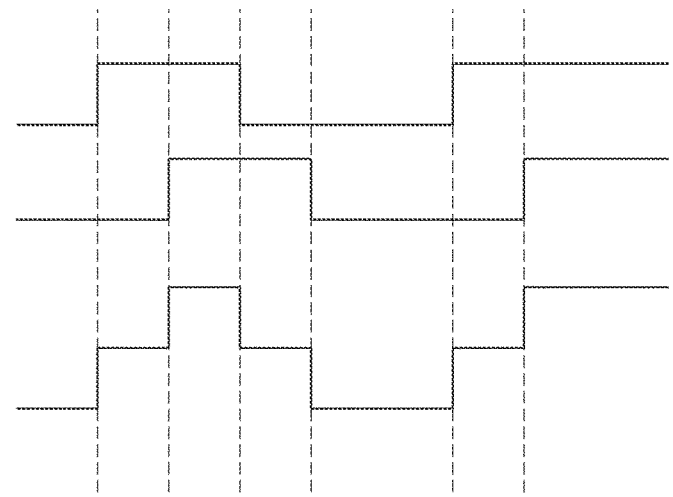
FIGS. 5B and 5C show examples of two primary switching events and their secondary switching events and the result of overlapping.
Figure 5C:
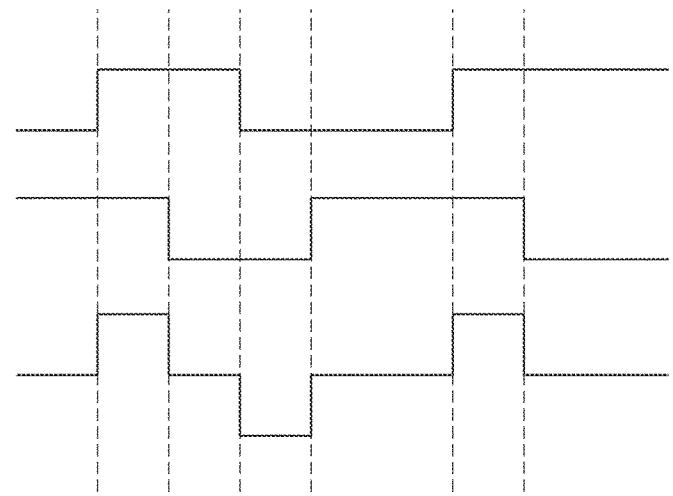

The secondary switching events which are initiated by different primary switching events may overlap. FIGS. 5B and 5C show examples of two primary switching events and their secondary switching events and the result of overlapping. The top two rows of FIG. 5B show the first and second primary switching events which are followed by secondary switching events derived from each primary switching event, respectively. The third row of FIG. 5B shows the overlapping result of the two primary switching events and their secondary switching events. FIG. 5C shows another example of two primary switching events and the secondary switching events and the overlapping result.

Referring again to FIG. 3, the loading logic 116a, 116b for shift register loads the secondary switching events to the shift register 114a, 114b, respectively, in response to the primary switching event. The secondary switching events are loaded to the shift registers 114a, 114b for the delay time T1 and T2. The secondary switching events are shifted along the shift register 114a, 114b at each clock and after the delay time (e.g. T1 and T2, respectively) those previously scheduled secondary switching events are combined with the then-current primary switching event in the combiner 118 to determine the new supply voltage level (i.e. the level select signal 160) which needs to be switched to the supply filter 130.

The level selection circuitry 110 may include an integrator 119 (e.g. a loop filter) for integrating the outputs of the combiner 118 before generating the level select signal 160 to the switch 120.

Figure 7A:
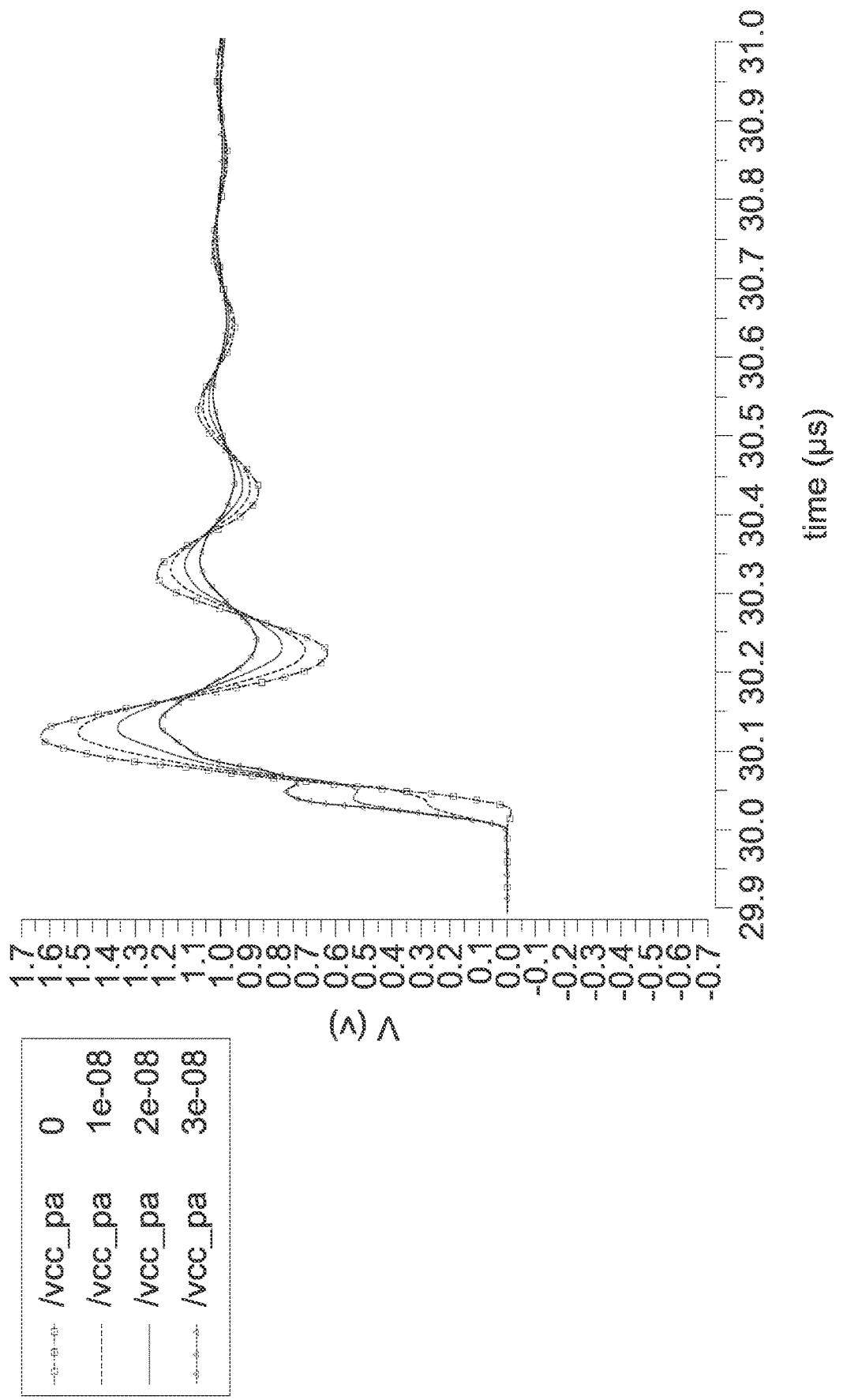
FIGS. 7A-7C shows step responses of the supply filter for different delay times.
Figure 7B:
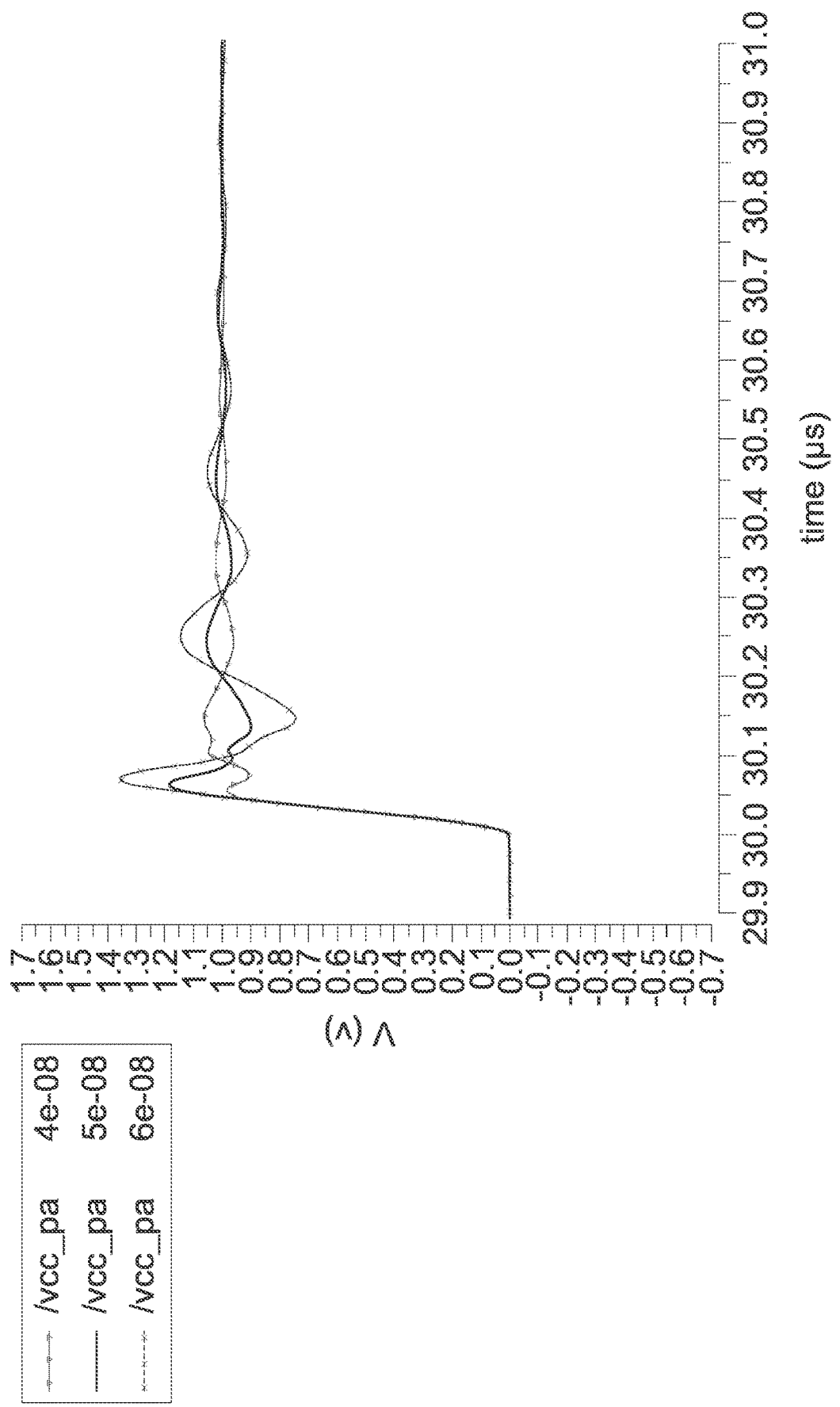
Figure 7C:
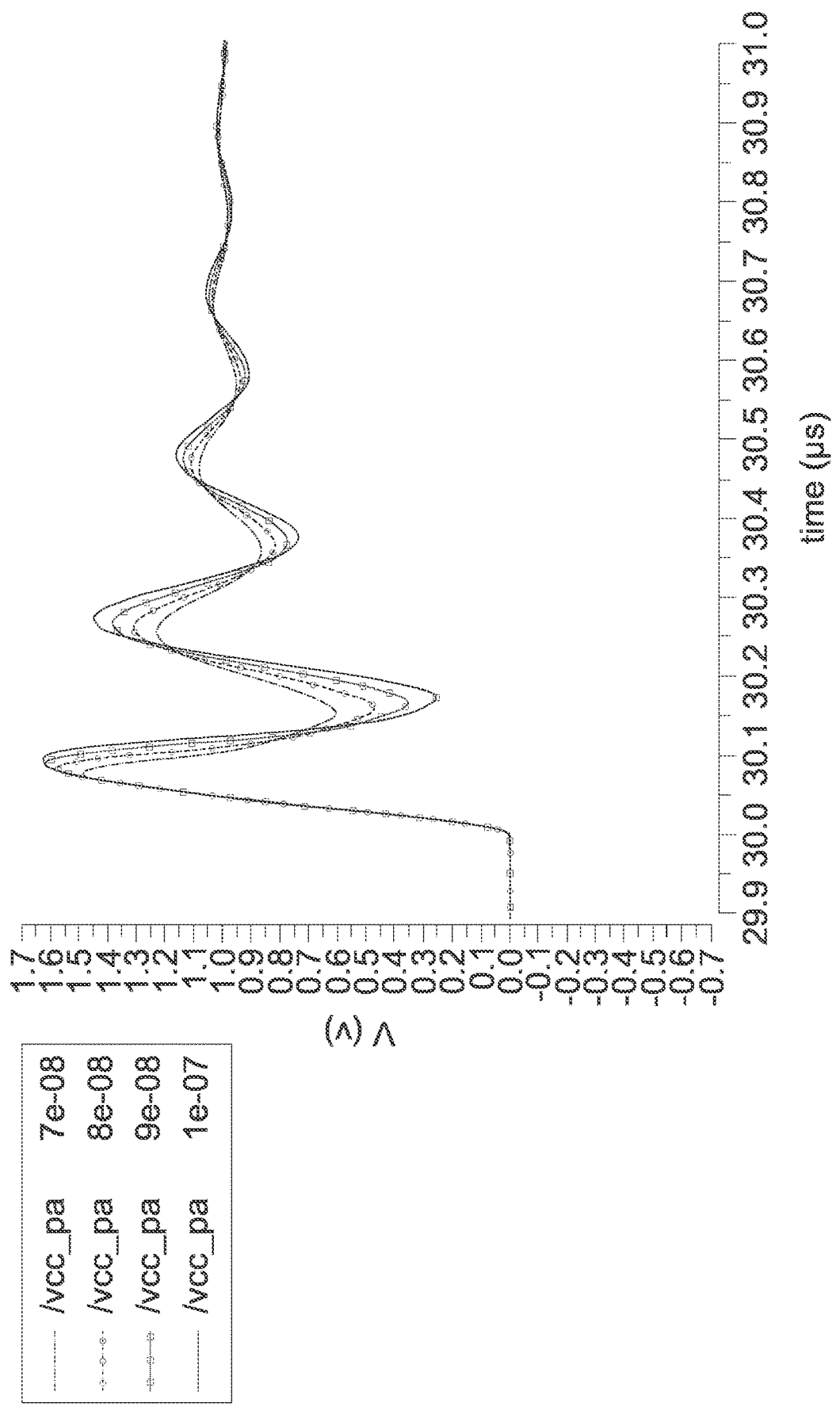

FIGS. 7A-7C show step responses of the supply filter 130 for different delay times (T1) in one example. FIGS. 7A-7C show step responses of the supply filter 130 with varying T1 while T2 is fixed as an example. FIGS. 7A-7C are an example for showing that how the choice of the delay time T1 and T2 influences the step response of the supply filter 130. With a proper selection of T1 and T2, which is filter specific, the supply filter 130 may show a step response with very low peaking even without snubber resistance. In the example of FIGS. 7A-7C, the peaking is lowest at T1 of 10' second. Since the proper delay times T1 and T2 are filter specific, different values of T1 and T2 should be selected for different supply filter structure.

Figure 8:
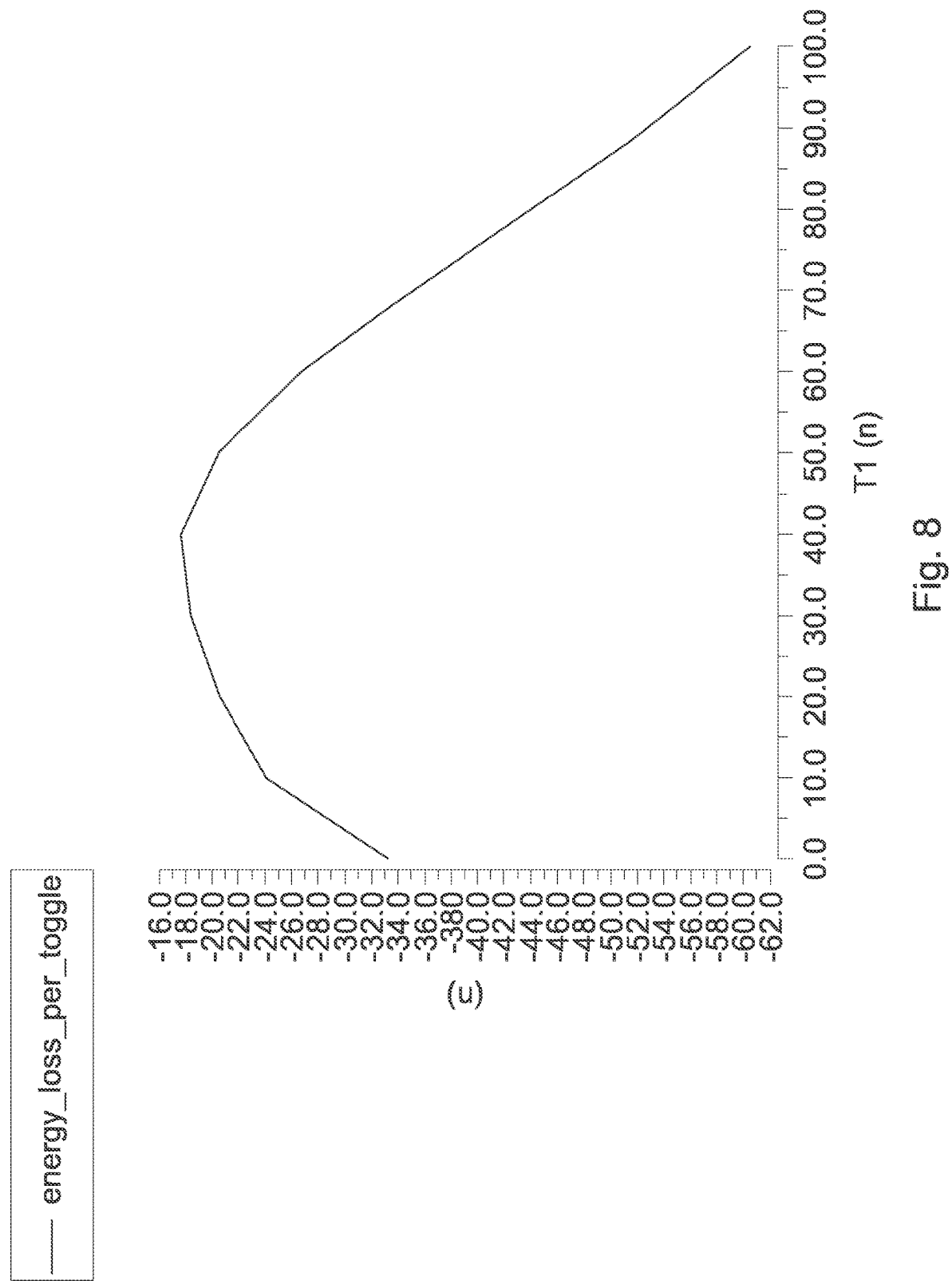
FIG. 8 shows an example of energy loss of a single up-down switching pulse over time T1.

Even without snubber resistance there is parasitic resistance in the system. This parasitic resistance causes the ringing to decay, but it also dissipates the ringing energy which is an efficiency loss. The lower the peaking and ringing the lower the losses. This can be seen in FIG. 8. FIG. 8 shows an example of energy loss of a single up-down switching pulse over time T1. If T1 is chosen properly the power dissipation can be the smallest (the peak of the curve as numbers are negative). This is an example with 0.5 Ohm snubber resistance in the supply filter 130 as shown in FIG. 6. FIG. 8 shows that the energy loss per toggle event can be reduced roughly by two, i.e. from 34 nJ (at T1=0) to 18 nJ (at T1=around 40 ns at the peak of the graph).

Figure 9:
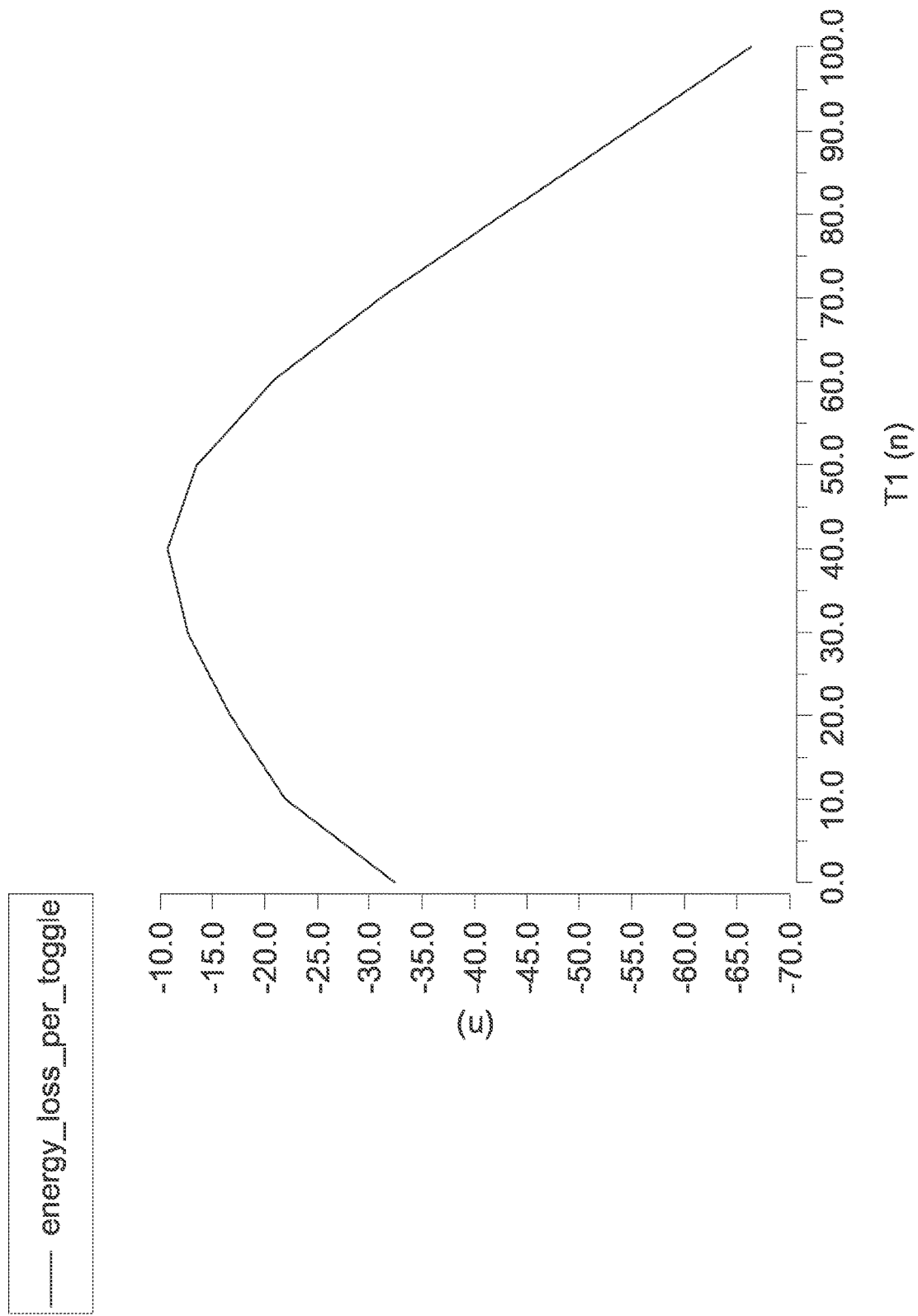
FIG. 9 shows an example of energy loss of a single up-down switching pulse over time T1 in case no snubber resistor is used.

The benefit can be higher if no snubber resistance is used at all. FIG. 9 shows an example of energy loss of a single up-down switching pulse over time T1 in case no snubber resistor is used. FIG. 9 shows that the energy loss per toggle event is reduced roughly by three (3× energy saving in filter), i.e. from 34 nJ (at T1=0) to 11 nJ (at T1=around 40 ns at the peak of the graph).

If the delay times T1 or T2 are set improperly (e.g. due to a firmware bug, etc.), there can be peaking at the output of the supply filter 130. In order to avoid that this peaking (which may occur in error cases) damages the power amplifier 140, a clamping device (e.g. a diode) may be included to limit the output of the supply filter 130 at a predetermined maximum level (e.g. the highest supply voltage level). FIG. 2 shows the clamping diode 150 connected between the output of the supply filter 130 and the highest supply voltage 104. If the peaking is too high the diode 150 clamps the voltage level to a value that does not damage the power amplifier 140.

A peak detector 170 (shown in FIG. 2) may be connected to the output of the supply filter 130, i.e. to the input of the power amplifier or to an intermediate node of the supply filter 130. The peak detector 170 may measure the peaks and provide a peak measurement signal representing an amount of peaking of a step response of the supply filter 130. Based on the measurement result of the peak detector 170, a calibration circuitry 172 may adjust the delay times T1 and/or T2 continuously (and automatically) to get the lowest peaking and so the lowest power consumption. The calibration circuitry 172 may tune the first delay time and/or the second delay time based on the peak measurement signal in a direction which reduces the peaking of the step response of the supply filer.

Figure 11:
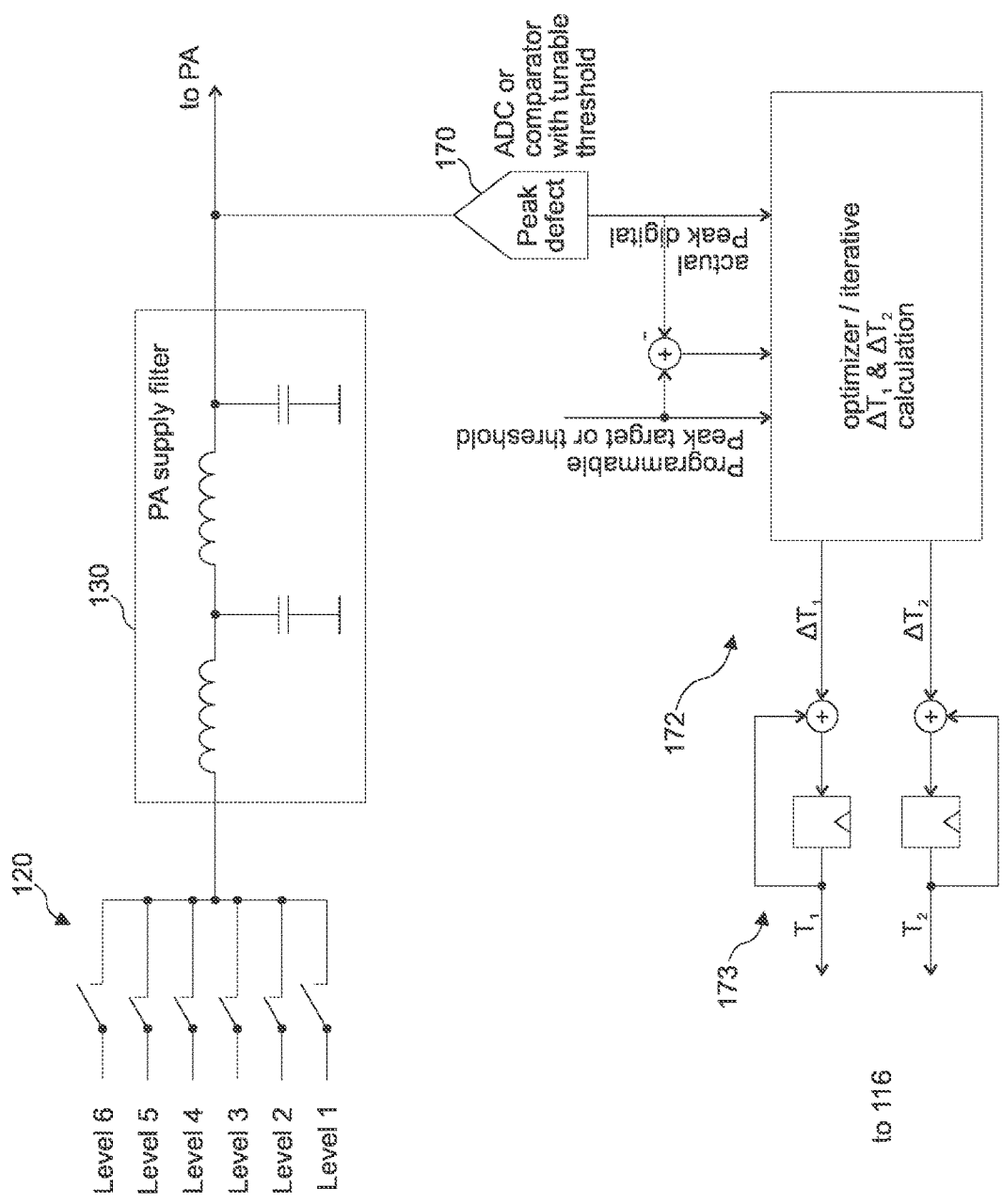
FIG. 11 shows a digital envelop tracker including a peak detector and a calibration circuitry in accordance with one example.

FIG. 11 shows a digital envelop tracker including a peak detector 170 and a calibration circuitry 172 in accordance with one example. The voltage peaking at the output of the PA supply filter, (i.e. at the input of the power amplifier), depends on the settings of the delay times T1 and T2. As the components in the PA supply filter 130 and the power amplifier 140 may vary (e.g. inductances L, capacitances C, or resistors R) from part to part, over time, over voltage, and/or over temperature, the times T1 and T2 may vary too. For this reason a peak detector 170 may be attached to the output of the PA supply filter 130. The peak detector 170 may be an ADC which measures the peak in a single shot, an iterative ADC or a threshold detector with a tunable threshold (e.g. a comparator with a tunable threshold). The peak detector 170 measures whether a certain peaking level has been reached or it quantifies as peaking in a digital representation. The peak detector 170 provides the actual peak digits to the calibration circuitry 172. The calibration circuitry 172 (an optimizer) may also receive a target value for the peak (a programmable peak target or threshold) and try to minimize the peak or to make the peak equal to the provided peak target. The calibration circuitry 172 may adjust the times T1 and T2 such that the optimization goal is met. The calibration circuitry 172 may iteratively calculate $\Delta T1$ and $\Delta T2$ for increase or decrease of T1 and T2 and calculates T1 and T2 with a loop filter 173. The calibration circuitry 172 then provides the adjusted T1 and T2 values to the level selection circuitry 110 (e.g. to the loading logics 116a/116b). The actual T1 and T2 values which are provided to the loading logics 116a/116b (schedulers)) may be continuously increased or decreased. The tuning of the times T1 and T2 may be done either continuously in order to adapt permanently to the actual conditions or periodically, i.e. from time to time when a significant change is expected.

Figure 10:
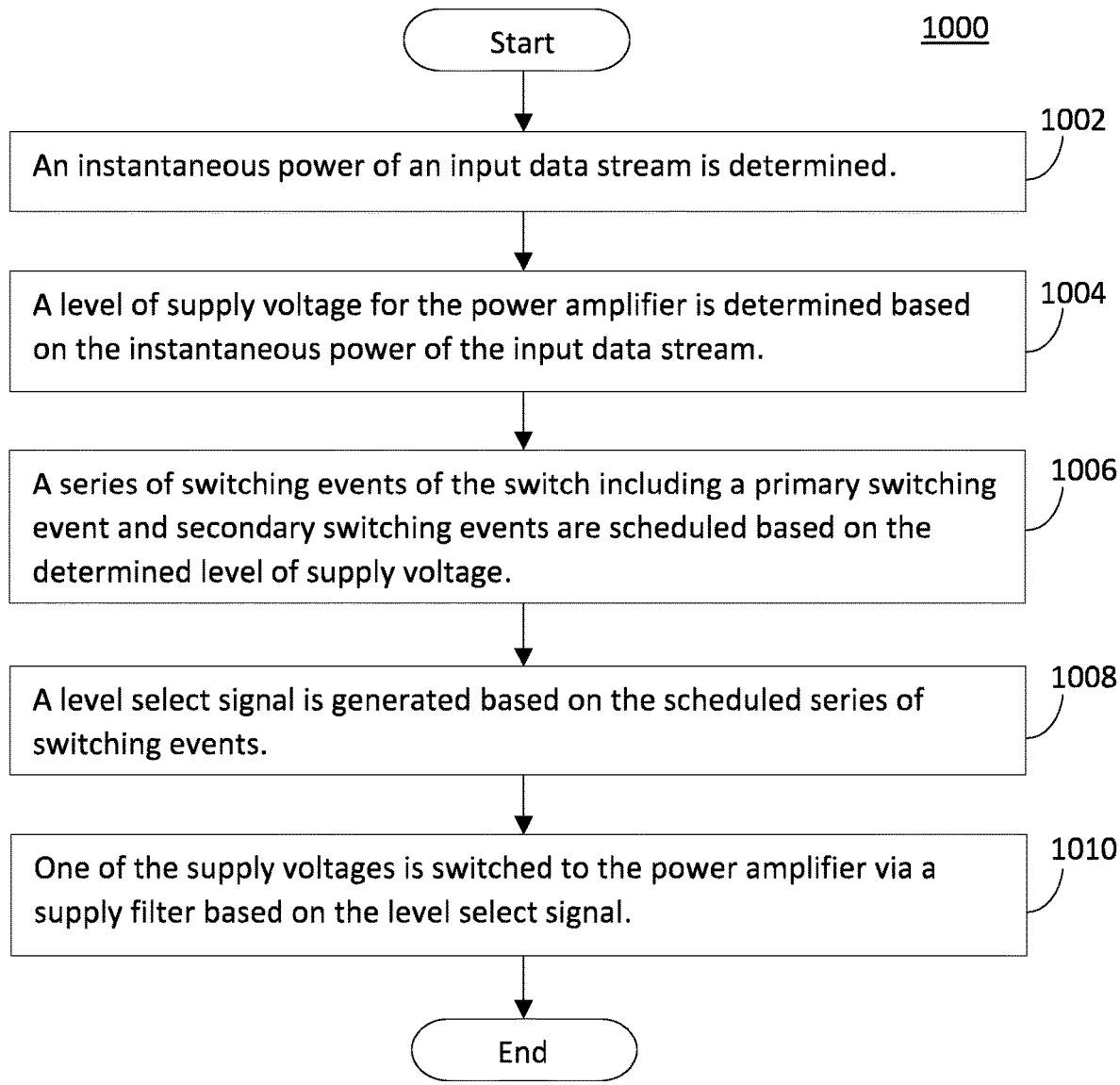
FIG. 10 is a flow diagram of a process of digital envelop tracking and controlling a supply voltage to a power amplifier in accordance with one example.

FIG. 10 is a flow diagram of a process of digital envelop tracking and controlling a supply voltage to a power amplifier in accordance with one example. An instantaneous power of an input data stream is determined (1002). A level of supply voltage for the power amplifier is determined based on the instantaneous power of the input data stream (1004). A series of switching events of the switch including a primary switching event and secondary switching events are scheduled based on the determined level of supply voltage (1006). The primary switching event is scheduled based on the determined level of supply voltage and the secondary switching events are scheduled with respect to the primary switching event based on the determined level of supply voltage. A level select signal is generated based on the scheduled series of switching events (1008). The scheduled switching events are combined to generate the level select signal for the switch. One of the supply voltages is switched to the power amplifier via a supply filter based on the level select signal (1010).

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

Example 1 is a digital envelop tracker for a power amplifier. The digital envelop tracker includes a supply filter configured to filter a supply voltage to be supplied to a power amplifier, a level selection circuitry configured to determine a level of supply voltage based on an instantaneous power of an input data stream, schedule a series of switching events based on the determined level of supply voltage, and generate a level select signal based on the scheduled series of switching events, and a switch configured to connect one of a plurality of supply voltages in different levels to the supply filter based on the level select signal.

Example 2 is the digital envelop tracker of example 1, wherein the level selection circuitry includes a primary switching circuitry configured to schedule a primary switching event of the switch based on the determined level of supply voltage, a secondary switching circuitry configured to schedule secondary switching events of the switch at time instances delayed from the primary switching event based on the determined level of supply voltage, and a combiner configured to combine the primary switching event and previously scheduled secondary switching events to generate the level select signal.

Example 3 is the digital envelop tracker of example 2, wherein the secondary switching circuitry is configured to schedule the secondary switching events at time instances after the primary switching event to generate a filter response of the supply filter with reduced peaking.

Example 4 is the digital envelop tracker as in any one of examples 2-3, wherein the secondary switching circuitry includes a first shift register for registering a secondary switching event for increase of the supply voltage, and a second shift register for registering a secondary switching event for decrease of the supply voltage.

Example 5 is the digital envelop tracker as in any one of examples 2-4, wherein the level selection circuitry includes an integrator configured to integrate at least two outputs of the combiner to generate the level select signal.

Example 6 is the digital envelop tracker as in any one of examples 1-5, further including a clamping device configured to limit an output of the supply filter at a predetermined maximum level.

Example 7 is the digital envelop tracker as in any one of examples 2-6, wherein the secondary switching includes a first secondary switching at a first delay time from the primary switching in an opposite direction from the primary switching and a second secondary switching at a second delay time from the first secondary switching in a same direction as the primary switching.

Example 8 is the digital envelop tracker of example 7, wherein the first delay time and the second delay time are determined based on a step response of the supply filter.

Example 9 is the digital envelope tracker as in any one of examples 7-8, including a peak detector configured to provide a peak measurement signal representing an amount of peaking of a step response of the supply filter, and a calibration circuitry configured to tune the first delay time and/or the second delay time based on the peak measurement signal in a direction which reduces the peaking of the step response of the supply filter.

Example 10 is a method of digital envelop tracking and controlling a supply voltage to a power amplifier wherein one of a plurality of supply voltages is supplied to the power amplifier via a switch. The method includes determining an instantaneous power of an input data stream, determining a level of supply voltage for the power amplifier based on the instantaneous power of the input data stream, scheduling a series of switching events of the switch based on the determined level of supply voltage, generating a level select signal based on the scheduled series of switching events, and supplying one of the plurality of supply voltages to the power amplifier via a supply filter based on the level select signal.

Example 11 is the method of example 10, wherein the level select signal is generated by scheduling a primary switching event of the switch based on the determined level of supply voltage, scheduling secondary switching events of the switch delayed from the primary switching event based on the determined level of supply voltage, and combining the primary switching event and previously scheduled secondary switching events to generate the level select signal for the switch.

Example 12 is the method of example 11, wherein the secondary switching events are scheduled at time instances after the primary switching event to generate a filter response of the supply filter with reduced peaking.

Example 13 is the method as in any one of examples 11-12, wherein the secondary switching includes a first secondary switching at a first delay time from the primary switching in an opposite direction from the primary switching and a second secondary switching at a second delay time from the first secondary switching in a same direction as the primary switching.

Example 14 is the method of example 13, including determining an amount of peaking of a step response of the supply filter, and tuning the first delay time and/or the second delay time based on the amount of peaking in a direction which reduces the peaking of the step response of the supply filer.

Example 15 is the method as in any one of examples 10-14, wherein the series of switching events are scheduled such that a first step response of the supply filter is combined with second and third step responses of the supply filter such that a steady state value of combination of step responses is equal to a steady state value of the first step response and peaking of the combination of step responses is less than peaking of the first step response.

Example 16 is a computer program having a program code for performing at least one of methods in examples 10-15.

Example 17 is a machine-readable storage including machine readable instructions, when executed, to implement a method or realize an apparatus as in any one of examples 1-15.

Example 18 is a machine-readable medium including code, when executed, to cause a machine to perform any of the methods in examples 10-15.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A digital envelop tracker circuitry, comprising:
a level selection circuitry configured to determine a level of supply voltage based on a power of an input data stream and generate a level select signal,
wherein the level select signal is generated based on a series of voltage level switching events triggered by each determined level of supply voltage,
wherein the level selection circuitry comprises:
a primary switching circuitry configured to schedule a primary switching event of the switch based on the determined level of supply voltage,
a secondary switching circuitry configured to schedule secondary switching events of the switch at time instances delayed from the primary switching event based on the determined level of supply voltage, and
a combiner configured to combine the primary switching event and previously scheduled secondary switching events to generate the level select signal, and
a switch configured to connect one of a plurality of supply voltages in different levels to a supply filter based on the level select signal.

2. The digital envelop tracker circuitry of claim 1, wherein the secondary switching circuitry is configured to schedule the secondary switching events at time instances after the primary switching event to generate a filter response of the supply filter with reduced peaking.

3. The digital envelop tracker circuitry of claim 1, wherein the secondary switching circuitry comprises:

a first shift register for registering a secondary switching event for increase of the supply voltage, and a second shift register for registering a secondary switching event for decrease of the supply voltage.

4. The digital envelop tracker circuitry of claim 1, wherein the level selection circuitry includes an integrator configured to integrate at least two outputs of the combiner to generate the level select signal.

5. The digital envelop tracker circuitry of claim 1, further comprising:

the supply filter configured to filter the supply voltage.

6. The digital envelop tracker circuitry of claim 1, further comprising:

a clamping device configured to limit an output of the supply filter at a predetermined maximum level.

7. The digital envelop tracker circuitry of claim 1, wherein the secondary switching includes a first secondary switching at a first delay time from the primary switching in an opposite direction from the primary switching and a second secondary switching at a second delay time from the first secondary switching in a same direction as the primary switching.

8. The digital envelop tracker circuitry of claim 7, wherein the first delay time and the second delay time are determined based on a step response of the supply filter.

9. The digital envelope tracker circuitry of claim 7, comprising:

a peak detector configured to provide a peak measurement signal representing an amount of peaking of a step response of the supply filter, and a calibration circuitry configured to tune the first delay time and/or the second delay time based on the peak measurement signal in a direction which reduces the peaking of the step response of the supply filter.

10. A method of digital envelop tracking and controlling a supply voltage wherein one of a plurality of supply voltages is supplied via a switch, the method comprising:

determining a power of an input data stream, determining a level of supply voltage based on the power of the input data stream, and generating a level select signal, wherein the level select signal is generated based on a series of voltage level switching events triggered by each determined level of supply voltage, and wherein the level select signal is generated by:

scheduling a primary switching event of the switch based on the determined level of supply voltage, scheduling secondary switching events of the switch delayed from the primary switching event based on the determined level of supply voltage, and combining the primary switching event and previously scheduled secondary switching events to generate the level select signal for the switch.

11. The method of claim 10, wherein one of the plurality of supply voltages is supplied via a supply filter and the secondary switching events are scheduled at time instances after the primary switching event to generate a filter response of the supply filter with reduced peaking.

12. The method of claim 10, wherein the secondary switching includes a first secondary switching at a first delay time from the primary switching in an opposite direction from the primary switching and a second secondary switching at a second delay time from the first secondary switching in a same direction as the primary switching.

13. The method of claim 11, comprising:

determining an amount of peaking of a step response of the supply filter, and tuning the first delay time and/or the second delay time based on the amount of peaking in a direction which reduces the peaking of the step response of the supply filer.

14. The method of claim 11, wherein the series of voltage level changes are scheduled such that a first step response of the supply filter is combined with second and third step responses of the supply filter such that a steady state value of combination of step responses is equal to a steady state value of the first step response and peaking of the combination of step responses is less than pealing of the first step response.

15. A non-transitory, machine-readable storage including machine-readable instructions, when executed on a machine, to implement a method as in claim 10.

* * * * *